(12) United States Patent
Ikeda et al.

(10) Patent No.: US 6,263,959 B1
(45) Date of Patent: *Jul. 24, 2001

(54) PLATE TYPE HEAT PIPE AND COOLING STRUCTURE USING IT

(75) Inventors: Masami Ikeda; Masaaki Yamamoto; Hitoshi Sho; Tatsuhiko Ueki, all of Tokyo (JP)

(73) Assignee: Furukawa Electric Co. Ltd. (JP)

( * ) Notice: Subject to any disclaimer, the term of this patent is extended or adjusted under 35 U.S.C. 154(b) by 0 days.

This patent is subject to a terminal disclaimer.

(21) Appl. No.: 09/445,738

(22) PCT Filed: Apr. 6, 1999

(86) PCT No.: PCT/JP99/01809

§ 371 Date: Dec. 10, 1999

§ 102(e) Date: Dec. 10, 1999

(87) PCT Pub. No.: WO99/53255

PCT Pub. Date: Oct. 21, 1999

(30) Foreign Application Priority Data

Apr. 13, 1998 (JP) .................................................. 10-099783

(51) Int. Cl.[7] .................................................... F28D 15/00

(52) U.S. Cl. .................................. 165/104.26; 165/104.33; 361/700

(58) Field of Search ......................... 165/104.26, 104.21, 165/104.33; 174/15.2; 361/700, 687, 720; 257/715

(56) References Cited

U.S. PATENT DOCUMENTS 6,082,443 * 7/2000 Yamamoto et al. ............ 165/104.26

* cited by examiner

Primary Examiner—Marvin M. Lateef
Assistant Examiner—Terrell McKinnon
(74) Attorney, Agent, or Firm—Cantor Colburn LLP

(57) ABSTRACT

A plate type heat pipe comprises two plate members facing each other to form a hermetically sealed container, on either one of which plate members at least one heat generating parts are mounted, at least one heat transfer block having a cross sectional area equal to or larger than a cross sectional area of the heat generating part, the heat transfer block being disposed at a prescribed position within the hollow portion corresponding to a position of the plate member to which the heat generating part is thermally connected, and a working fluid enclosed in the container.

12 Claims, 4 Drawing Sheets

PLATE TYPE HEAT PIPE AND COOLING STRUCTURE USING IT

FIELD OF THE INVENTION

The present invention relates to a plate type heat pipe, in particular a plate type heat pipe excellent cooling efficiency without causing a so-called dry out, and a cooling device using the plate type heat pipe to effectively cool heat generating parts such as semiconductor chips.

BACKGROUND OF THE INVENTION

Electronic components such as semiconductor chips or the like mounted on electric or electronic devices including electrical power equipment, various devices such as personal computers or the like generate heat in some extent when used. When the electronic components are excessively heated, the performance thereof is lowered, or the lifetime thereof is shortened. The technology to cool the electronic components is therefore an important technical issue. There is known as a method of cooling heat generating parts, for example, a cooling method by means of ventilating air in the interior of devices by fans to cool same, a cooling method by means of attaching heat dissipating fins to the heat generating parts to cool same, or a cooling method by means of using a heat pipe to cool same.

Metallic materials such as copper, aluminum or the like which has a higher heat conductivity, ceramics such as carbon material, aluminum nitride or the like which has a higher heat conductivity are preferably used as the fins which are attached to the heat generating parts. However, heat generating parts are not sufficiently cooled by the cooling method by means of attaching heat dissipating fins thereto. Thus, a plate type heat pipe comes to be used to cool heat generating parts.

The heat pipe is briefly described hereunder. The heat pipe includes a container having a hermetically sealed hollow portion, i.e., cavity therein, and a working fluid enclosed within the container. A heat is transferred from a heat absorbing portion to a heat dissipating portion, which is apart each other, by means of phase transition and movement of a working fluid accommodated within the hollow portion. The interior of the container is kept under the reduced pressure by means of evacuating in vacuum in order to facilitate phase transition of the working fluid.

When a portion of the container constructing the heat pipe is heated, the heat is transferred to the working fluid existing in the corresponding portion in the hollow portion (which portion is called as a heat absorbing side or heat absorbing portion), thus the working fluid is vaporized by the heat. Thus produced vapor of the working fluid flows within the hollow portion to the portion (which portion is called as a heat dissipating side or heat dissipating portion) of the heat pipe to which heat dissipating fins are attached, for example, and then the vapor is cooled enough in the portion to be condensed to a liquid phase. The working fluid thus condensed back to the liquid phase flows back (circulates) to the heat absorbing side by the function of gravity or the like. The heat is thus transferred by means of phase transition and movement of the working fluid as described above.

To secure the continuous circulation of the working fluid, the heat absorbing side is in general disposed below the heat dissipating side. When thus disposed, the working fluid transferred back to the liquid phase in the heat dissipating side flows back to the heat absorbing side by gravity. However, for example such electric or electronic devices as a note book type personal computer is largely inclined when used, or sometimes the personal computer is placed upside down according to the conditions to be used. Under those conditions, such a case actually happens that the working fluid hardly flows back by gravity.

In order to solve the above-mentioned problem, there is disposed a wick having a capillary action in the interior of the heat pipe (hollow portion). Metal mesh or metal wire is used as the wick, and in addition, fine longitudinal grooves are formed in the inner wall of the hollow portion to perform the capillary action.

Aluminum material, copper material, stainless steel material or the like is usually used as the material of the container forming the heat pipe. However, the container as a whole is not necessarily formed by the same material. Different materials may be used as combined to form the container. In addition, water, substituted Freon, alcohol or the like may be used as the working fluid.

Heat generating parts to be cooled are, typically for example, semiconductor chips or the like. The heat generating parts such as semiconductor chips are generally used in a fashion as mounted on a printed wiring board. As a cooling method of the heat generating parts, there is a favorable cooling method in which a plate type heat pipe and the printed wiring board are disposed face to face each other in such manner that the heat generating parts mounted on the printed wiring board are caused to contact with the facing surface of the heat pipe. The heat generating parts may directly contact with the surface of the heat pipe. The heat generating parts may contact with the surface of the heat pipe through a heat transfer grease or the like placed therebetween to reduce the contact resistance. In some case, the heat generating parts are joined to the surface of the heat pipe by soldering or the like.

However, the heat generating parts such as semiconductors or the like are small in size. Accordingly, even though the heat generating parts are caused to contact with the plate type heat pipe, the contacting area thereof is small. As a result, when a heat generating density of the heat generating part is high, the so-called dry out phenomenon is easily caused to occur in the corresponding portion or the vicinity thereof within the heat pipe to which the heat generating part is connected, in which phenomenon the working fluid is vaporized out and no working fluid in liquid phase exists in the portion.

When the so-called dry out phenomenon actually occurs, the heat generated by the heat generating parts is not fully transferred to the working fluid in the interior of the heat pipe, thus the heat generating parts are not effectively cooled to result in causing a trouble.

SUMMARY OF THE INVENTION

The object of the present invention is to provide a plate type heat pipe which enables to effectively cool the heat generating parts without causing the so-called dry out phenomenon even in case that the heat generating density of the heat generating part is high.

The inventors have studied intensively to overcome the above-mentioned conventional heat pipe. As a result, it is found that when a heat transfer block having a cross sectional area equal to or larger than the cross sectional area of the heat generating part and having a higher heat conductivity is disposed at the corresponding position in the interior of the heat pipe to which the heat generating part is thermally connected, the cooling efficiency on the same sectional area can be improved even in the case that the heat generating density is high, because the heat diffuses along the longitudinal axis of the heat transfer block. The present invention is made on the basis of the above finding.

The first embodiment of the plate type heat pipe of the present invention comprises:

two plate members facing each other to form a hermetically sealed container, on either one of which plate members at least one heat generating parts are mounted;

at least one heat transfer block having a cross sectional area equal to or larger than a cross sectional area of said heat generating part, said block being disposed at a prescribed position within said hollow portion corresponding to a position of said plate member to which said heat generating part is thermally connected; and a working fluid enclosed in said hollow portion.

The second embodiment of the plate type heat pipe comprises:

two plate members facing each other to form a hermetically sealed container, on either one of which plate members at least one heat generating parts are mounted;

a heat transfer block disposed at a prescribed position within said container corresponding to a position of said plate member to which a heat generating part having a largest heat generating density is thermally connected, said heat transfer block having a cross sectional area equal to or larger than a cross sectional area of said heat generating part having a largest heat generating density; and a working fluid enclosed in said container.

In the third embodiment of the plate type heat pipe of the invention, respective heat transfer blocks are disposed at said prescribed positions within said container corresponding to positions of said plate member to which plurality of said heat generating parts are thermally connected, said respective heat transfer blocks having respective cross sectional areas equal to or larger than a cross sectional area of corresponding heat generating parts.

In the fourth embodiment of the plate type heat pipe of the invention, at least one portions of said plate member to which said heat generating parts are thermally connected extend outward said container to form protruding portions.

In the fifth embodiment of the plate type heat pipe of the invention, a wick contacting said heat transfer block is disposed within said container.

In the sixth embodiment of the plate type heat pipe of the invention, edge portions of said heat transfer block are cut off.

In the seventh embodiment of the plate type heat pipe of the invention, said heat transfer block contacts with both of said two plate members.

In the eighth embodiment of the plate type heat pipe of the invention, a heat sink is disposed on one of said plate members to which said heat generating part is not connected.

In the ninth embodiment of the plate type heat pipe of the invention, said protruding portion is disposed in such manner that said protruding portion closely contacts with said heat generating part mounted on a printed wiring board.

An embodiment of the cooling apparatus of the present invention comprises the plate type heat pipe as described in any one of the above embodiments arranged to face a printed wiring board on which at least one of heat generating parts are mounted in such manner that said heat generating parts are in close contact with one of said plate member of said plate type heat pipe, and a heat sink is disposed on the other plate member of said plate type heat pipe.

DETAILED DESCRIPTION OF THE PREFERRED EMBODIMENTS

Figure 1:
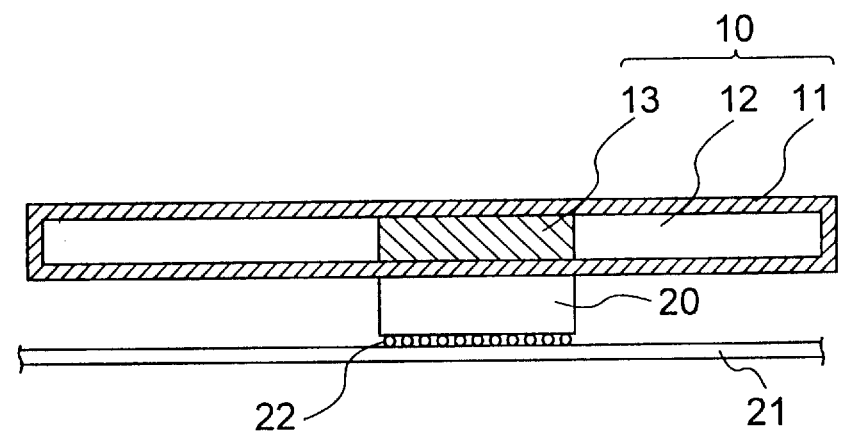
FIG. 1 is a schematic side sectional view of one embodiment of the plate type heat pipe of the invention.

The plate type heat pipe of the present invention comprises (1) two plate members facing each other to form a hermetically sealed container, on either one of which plate members at least one heat generating parts are mounted, (2) at least one heat transfer block having a cross sectional area equal to or larger than a cross sectional area of the heat generating part, the heat transfer block being disposed at a prescribed position within the container corresponding to a position of the plate member to which the heat generating part is thermally connected, and (3) a working fluid enclosed in the container.

Furthermore, the plate type heat pipe of the present invention may comprises (1) two plate members facing each other to form a hermetically sealed container, on either one of which plate members at least one heat generating parts are mounted, (2) a heat transfer block disposed at a prescribed position within the container corresponding to a position of the plate member to which a heat generating part having a largest heat generating density is thermally connected, the heat transfer block having a cross sectional area equal to or larger than a cross sectional area of the heat generating part having a largest heat generating density, and (3) a working fluid enclosed in the container.

More specifically, in the plate type heat pipe of the invention, there may be the case that the number of the heat generating parts and the number of the heat transfer blocks are the same, for example, three heat generating parts having the same size are thermally connected to the plate member of the container, and the heat transfer block is disposed respectively at the corresponding position in the interior of the container, i.e., the hollow portion, to the position to which the heat generating part is connected.

Furthermore, in the plate type heat pipe of the invention, there may be the case that the number of the heat generating parts and the number of the heat transfer blocks are different, for example, three heat generating parts having the same size are thermally connected to the plate member of the container, and one heat transfer block is disposed at one of the three corresponding positions in the interior of the container to the positions to which the heat generating part is connected with no heat transfer block at the remaining two other corresponding positions.

Furthermore, in the plate type heat pipe of the invention, there may be the case that a plurality of heat generating parts are thermally connected to the plate member of the container, and one heat transfer block is disposed at the corresponding position in the interior of the container to the position to which the heat generating part having the highest heat generating density is connected with no heat transfer block at the remaining other corresponding positions.

Furthermore, in the plate type heat pipe of the invention, there may be the case, for example, that three heat generating parts are thermally connected to the plate member of the container, and one heat transfer block is disposed at the corresponding position in the interior of the container to the position to which the heat generating part having the highest heat generating density is connected, and in addition, one heat transfer block is disposed at the corresponding position in the interior of the container to the position to which one of the two remaining heat generating parts is connected with no heat transfer block at the remaining other corresponding position.

In any one of the above cases, there is disposed the heat transfer block having a cross sectional area equal to or larger than a cross sectional area of the respective heat generating part in the plate type heat pipe of the invention.

In the plate type heat pipe of the invention, at least one portion of the plate member of the container to which the heat generating part is connected may be extended outward the container to form a protruding portion. There is connected a heat generating part in close contact to the outer surface of the protruding portion. The heat transfer block may be disposed at the corresponding position in the interior of the container to the position at which the protruding portion is arranged. The height of the protruding portion is determined corresponding to the height of the heat generating part. More specifically, the protruding portion is disposed in such manner that the protruding portion closely contacts with the corresponding heat generating part mounted on a printed wiring board.

Furthermore, in the plate type heat pipe of the invention, there may be additionally disposed a wick contacting at least with the heat transfer block in the interior of the container, i.e., hollow portion. The wick may be disposed on all the inner walls of the container, and on all the side walls of the heat transfer block. The wick comprises mesh or wire made of metal or the like. Furthermore, in the plate type heat pipe of the invention, edge portions of the heat transfer block may be cut off. When edge portions of the heat transfer block are cut off, the wick will not be caught in the edge portions of the heat transfer block so as to prevent the wick from being damaged in case that the wick is disposed in the interior of the container. It is preferable that the heat transfer block contacts with two plate members forming the container.

In addition, a heat sink may be attached to the outer surface of the plate member to which the heat generating parts are not connected in the plate type heat pipe of the invention.

The plate type heat pipe of the invention is placed in such manner that each of the protruding portions is caused to closely contact with the corresponding heat generating part mounted on the printed wiring board.

Furthermore, in the cooling device of the invention, the plate type heat pipe of the invention is arranged to face the printed wiring board on which heat generating parts are mounted, and the heat generating parts are caused to contact with the plate member of the heat pipe, and in addition, a heat sink is attached to the outer surface of the other plate member of the heat pipe.

The plate type heat pipe of the invention is described with reference to drawings. FIG. 1 is a schematic side sectional view of one embodiment of the plate type heat pipe of the invention. A heat generating part 20 to be cooled is thermally connected to one main surface (i.e., the lower surface in the drawing) of the plate type heat pipe of the invention 10. In this embodiment, the heat generating part 20 is contacted through a heat transfer grease with the plate type heat pipe 10. The reference numeral 21 designates a printed wiring board on which the heat generating part 20 is mounted, and the reference numeral 22 designates a lead.

The plate type heat pipe of the invention 10 includes a hollow portion in the interior of the container 11 forming thereof, and a working fluid (not shown in the drawing) is enclosed in the hollow portion 12 in a prescribed amount. In the plate type heat pipe of the invention, a heat transfer block 13 is disposed at the corresponding position in the interior of the container to the position of the plate member to which the heat generating part 20 is thermally connected. The above-mentioned heat transfer block has the cross sectional area equal to or more than the cross sectional area of the heat generating part 20. In this embodiment, the cross sectional area of the heat transfer block 13 has almost equal to the cross sectional area of the heat generating part 20. However, the cross sectional area of the heat transfer block 13 may be larger than the cross sectional area of the heat generating part 20. In addition, in this embodiment, the heat transfer block 13 contacts with both of the lower inner wall and upper inner wall of the container.

Figure 2:
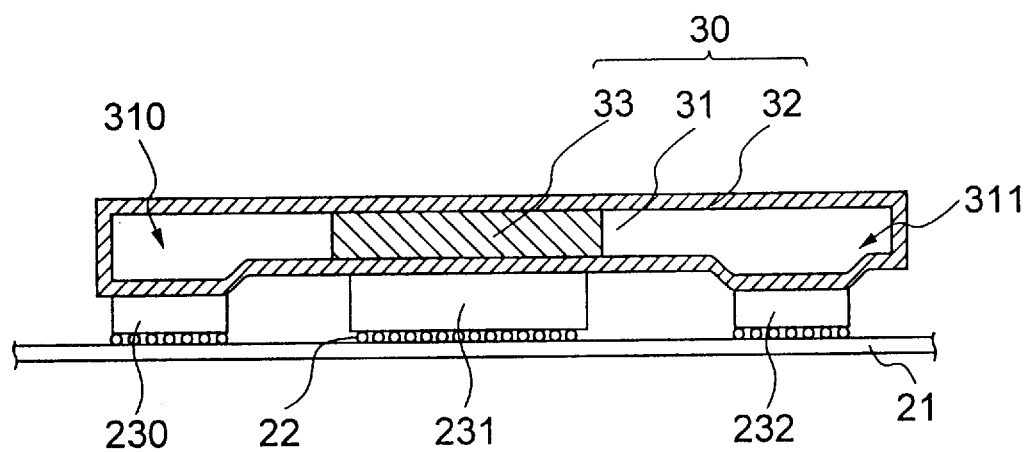
FIG. 2 is a schematic side sectional view of another embodiment of the plate type heat pipe of the invention.

FIG. 2 is a schematic side sectional view of another embodiment of the plate type heat pipe of the invention. The protruding portions 310, 311 are formed on one of the plate members of the container 32 constituting the plate type heat pipe 30 at the corresponding positions to the positions to which the heat generating parts 230, 232 are connected. The heights of the protruding portions are arranged in such manner that the plate type heat pipe and the printed wiring board are substantially parallel, more specifically, the total heights of the height of the protruding portion and the height of the corresponding heat generating part is substantially equal. In this embodiment, no protruding portion is formed at the corresponding position to the position to which the heat generating part 231 is connected.

In the above embodiment of the plate type heat pipe, the heat transfer block 33 is disposed at the corresponding position in the container 32 of plate type heat pipe 30 to the position to which the heat generating part 231 is connected (the working fluid in the interior of the container is not shown). The cross sectional area of the heat transfer block 33 is a little larger than the cross sectional area of the heat generating part 231. In the present invention, as described above, the size (i.e., cross sectional area) of the heat transfer block 33 is equal to or more than the size (i.e., cross sectional area) of the heat generating part 231. In this embodiment, there are disposed three heat generating parts 230, 231, 232, and the heat generating density of the heat generating part 231 is relatively larger than those of the other two heat generating parts 230, 232. More specifically, it is preferable that the heat transfer block is to be disposed at the corresponding position in the interior of the container to the position to which the heat generating part having the largest heat generating density is connected.

Figure 3:
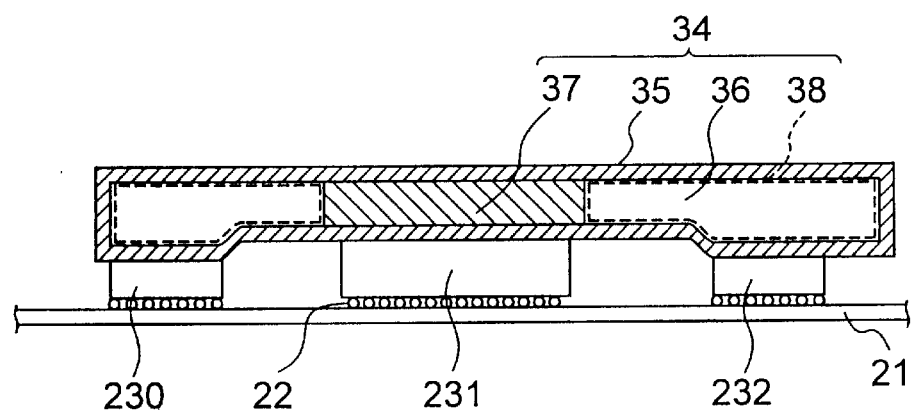
FIG. 3 is a schematic side sectional view of another embodiment of the plate type heat pipe of the invention.

The plate type heat pipe as shown in FIG. 3 includes a wick 38 comprising a metal mesh which is arranged so as to be disposed along the inner walls of the container and the side walls of the heat transfer block. By this arrangement of the wick, the circulating flow of the working fluid may be maintained to some extent by the capillary action even in the condition of the so-called top heat mode of the heat pipe (i.e., the heat absorbing side of the heat pipe is positioned above the heat dissipating side of the heat pipe), thus preferable. The reference numeral 35, 37 designate the container and the heat transfer block, respectively.

Figure 4:
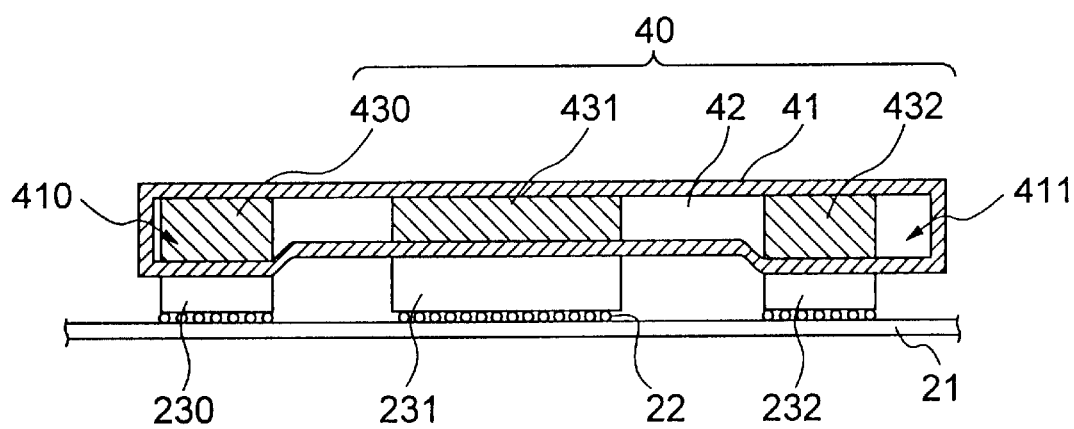
FIG. 4 is a schematic side sectional view of another embodiment of the plate type heat pipe of the invention.

FIG. 4 is a schematic side sectional view of another embodiment of the plate type heat pipe of the invention in which the heat transfer blocks are disposed at all the corresponding positions to which the heat generating parts are connected. More specifically, the plate type heat pipe has the protruding portions 410, 411 on which the heat generating parts 230, 232 are connected respectively. The heat generating part 231 is connected to the portion in which no protruding portion is arranged. Three heat transfer blocks 430, 431, 432 are disposed respectively at the corresponding positions in the interior of the container to the positions to which three heat generating parts 230, 231, 232 are connected as shown in FIG. 4. The reference numerals 41, 42 designate the container and the hollow portion, respectively.

Incidentally, when the wick is arranged in the interior of the container, it is preferable that the wick is caused to be in contact with the heat transfer block. The reason thereof is that by the above-mentioned arrangement of the wick, the working fluid flowing back to the heat absorbing side by the capillary action is caused to move easily toward the surface of the heat transfer block. Accordingly, the wick is preferably arranged so as to be in close contact with the heat transfer block.

Figure 5:
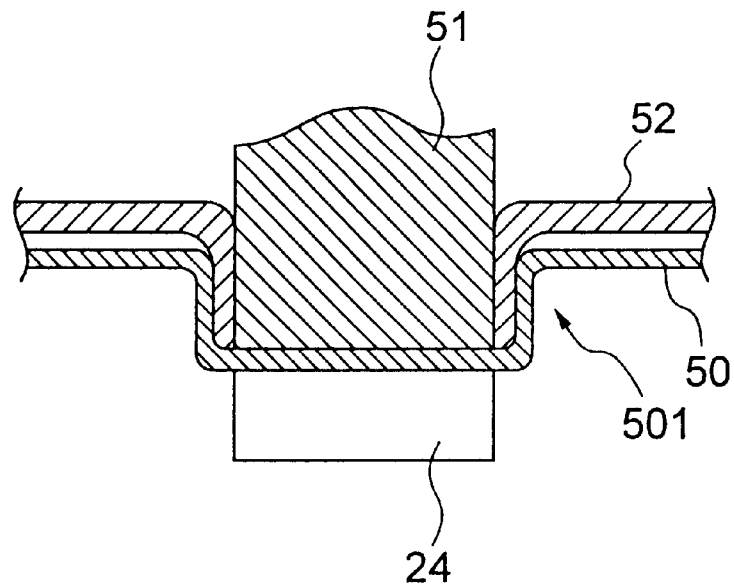
FIG. 5 is a descriptive view to show an essential portion of one embodiment of the plate type heat pipe of the invention.

FIG. 5 is a descriptive view to show an essential portion of one embodiment of the plate type heat pipe of the invention. In FIG. 5, it is shown that the wick is arranged so as to be in close contact with the heat transfer block. In this drawing, the essential portion, i.e., the heat transfer block and the vicinity thereof are shown as enlarged. The heat generating part 24 is connected to the outer surface of the protruding portion 501 formed on the container 50. The heat transfer block 51 is disposed in the interior of the protruding portion. The wick 52 is arranged in such manner that the wick is pinched between the inner wall of the protruding portion 501 and the outer surface of the heat transfer block 51, thus being in close contact with the heat transfer block 51.

Figure 6:
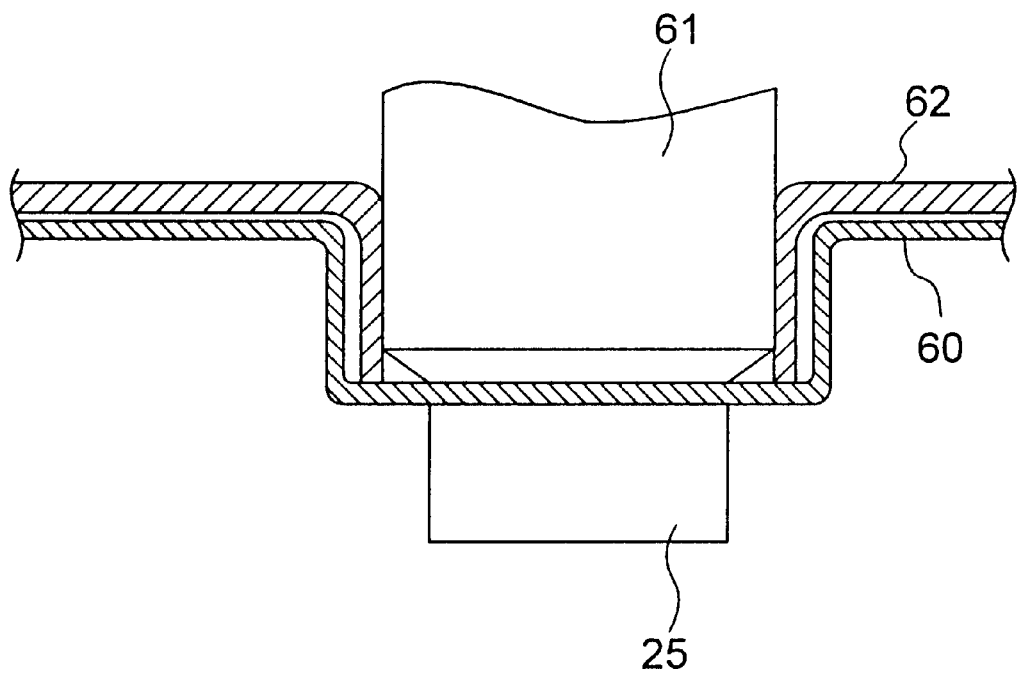
FIG. 6 is a descriptive view to show an essential portion of another embodiment of the plate type heat pipe of the invention.

Metal mesh or the like is used as the wick. When the wick is caused to be in close contact with the heat transfer block, there is a case that the wick is caught by the corner of the heat transfer block, thus damaging the part of the wick. Accordingly, as shown in FIG. 6, when the corners of the heat transfer block 61 are cut off, the wick 62 is prevented from being damaged. The reference numerals 60, 25 designate the container and the heat generating part, respectively.

Figure 7:
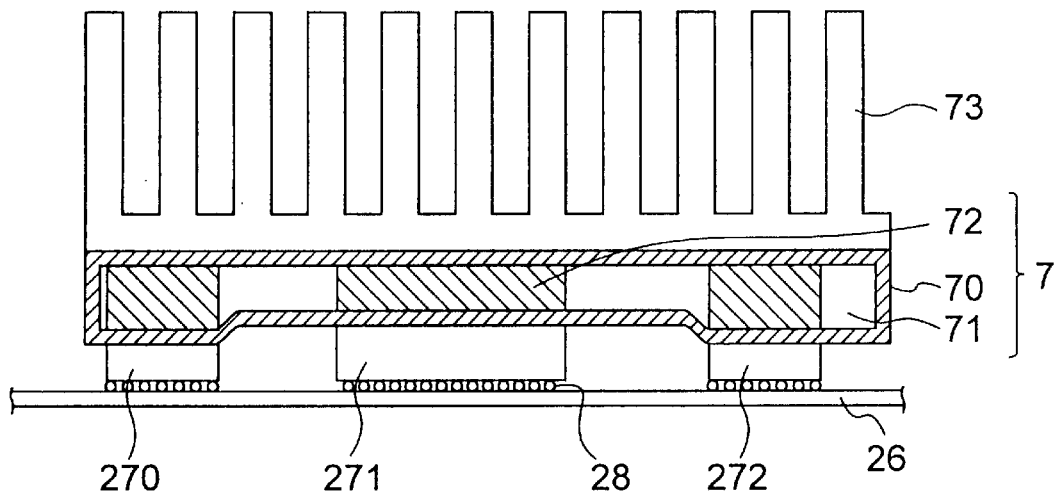
FIG. 7 is a descriptive view to show one embodiment of the cooling device using the plate type heat pipe of the invention.

FIG. 7 is a descriptive view to show one embodiment of the cooling device using the plate type heat pipe of the invention. The heat generating parts 270, 271, 272 practically mounted on the printed wiring board 26 are connected to the surface of one of the plate member (i.e., one of the main surface) of the plate type heat pipe 7. The reference numeral 28 designates the lead. The heat transfer block 72 having the largest cross sectional area is disposed at the corresponding position in the interior of the container 70 to the position to which the heat generating part 271 having the largest heat generating density is connected. In addition, the heat sink 73 is disposed on the surface of the other plate member (i.e., the other main surface) of the plate type heat pipe.

EXAMPLE

The plate type heat pipe of the invention is described in detail by the example.

Example 1

The container of the plate type heat pipe as shown in FIG. 1 was prepared by the use of the flat copper plate material of 1.0 mm in thickness, the size of which container was 100 mm in length, 70 mm in width and 6 mm in height. The copper heat transfer block of 25 mm in length, 25 mm in width and 4 mm in height, i.e., square pillar shape, was disposed at the central portion in the interior of thus prepared container. The interior of the container was evacuated and filled with a working fluid (not shown) to prepare the plate type heat pipe of the invention. The cross sectional area of the heat transfer block, i.e., 25 mm×25 mm, was equal to the cross sectional area of the heat generating part.

Thus prepared plate type heat pipe of the invention was arranged in such manner that the heat generating part 20 mounted on the printed wiring board 21 is placed to be in close contact through the lower plate member of the container 11 with the heat transfer block 13 at the same position, as shown in FIG. 1. An amount of the heat generated by the heat generating part was 130 w, the heat generating density of which was high. The heat generating part having such high heat generating density was effectively cooled without excessively heated by the use of the plate type heat pipe of the invention.

Example 2

The container of the plate type heat pipe as shown in FIG. 2 was prepared by the use of the flat copper plate material of 1.0 mm in thickness, the size of which container was 100 mm in length, 70 mm in width and 6 mm in height with the protruding portions provided at both end portions of the container. The height of the container at the protruding portions were 9 mm, and the width of the protruding portion was 10 mm. The copper heat transfer block of 25 mm in length, 25 mm in width and 4 mm in height, i.e., square pillar shape, was disposed at the central portion in the interior of thus prepared container.

The interior of the container was evacuated and filled with a working fluid (not shown) to prepare the plate type heat pipe of the invention. The cross sectional area of the heat transfer block, i.e., 25 mm×25 mm, was larger than the cross sectional area of the heat generating part.

Thus prepared plate type heat pipe of the invention with the protruding portions provided at both end portions was arranged in such manner that the central heat generating part 231 having the largest heat generating density mounted on the printed wiring board 21 was placed to be in close contact through the lower plate member of the container 32 with the heat transfer block 33 at the same position, and different heat generating parts were respectively disposed to be in close contact with the protruding portions, as shown in FIG. 2.

The amount of the heat generated by the central heat generating part was 130 w, the heat generating density of which was high. The central heat generating part having such high heat generating density as well as the other heat generating parts at both end portions were effectively cooled without excessively heated by the use of the plate type heat pipe of the invention.

Example 3

There was prepared the same container as prepared in Example 2 except that the wick was arranged across the inner walls of the container and the all side walls of the heat transfer block. More specifically, the container of the plate type heat pipe as shown in FIG. 3 was prepared by the use of the flat copper plate material of 1.0 mm in thickness, the size of which container was 100 mm in length, 70 mm in width and 6 mm in height with the protruding portions provided at both end portions of the container.

The height of the container at the protruding portions were 9 mm, and the width of the protruding portion was 10 mm. The copper heat transfer block of 25 mm in length, 25 mm in width and 4 mm in height, i.e., square pillar shape, was disposed at the central portion in the interior of thus prepared container. In addition, the wick was arranged across the inner walls of the container and the all side walls of the heat transfer block.

The interior of the container was evacuated and filled with a working fluid (not shown) to prepare the plate type heat pipe of the invention. The cross sectional area of the heat transfer block, i.e., 25 mm×25 mm, was larger than the cross sectional area of the heat generating part. Thus prepared plate type heat pipe of the invention with the protruding portions provided at both end portions was arranged in such manner that the central heat generating part 231 having the largest heat generating density mounted on the printed wiring board 21 was placed to be in close contact through the lower plate member of the container 35 with the heat transfer block 37 at the same position, and different heat generating parts 230, 232 were respectively disposed to be in close contact with the protruding portions, as shown in FIG. 3.

The amount of the heat generated by the central heat generating part was 130 w, the heat generating density of which was high. The central heat generating part having such high heat generating density as well as the other heat generating parts at both end portions were effectively cooled without excessively heated by the use of the plate type heat pipe of the invention.

Example 4

The container of the plate type heat pipe as shown in FIG. 4 was prepared by the use of the flat copper plate material of 1.0 mm in thickness, the size of which container was 100 mm in length, 70 mm in width and 6 mm in height with the protruding portions provided at both end portions of the container. The height of the container at the protruding portions were 9 mm, and the width of the protruding portion was 15 mm. The copper heat transfer block 431 of 25 mm in length, 25 mm in width and 4 mm in height, i.e., square pillar shape, was disposed at the central portion in the interior of thus prepared container.

Furthermore, the copper heat transfer block 430, 432 of 10 mm in length, 10 mm in width and 7 mm in height, i.e., square pillar shape, was disposed at each protruding portion in the interior of the container. The interior of the container was evacuated and filled with a working fluid (not shown) to prepare the plate type heat pipe of the invention. The cross sectional area of the central heat transfer block 431, i.e., 25 mm×25 mm, was equal to the cross sectional area of the central heat generating part 231. In addition, the cross sectional areas of the heat transfer blocks 430, 432 were equal to the cross sectional areas of the heat generating parts 230, 232, respectively.

Thus prepared plate type heat pipe of the invention with the protruding portions provided at both end portions was arranged in such manner that the central heat generating part, and the heat generating parts at end portions mounted on the printed wiring board 21 were respectively placed to be in close contact through the lower plate member of the container 41 with three heat transfer blocks 431, 430, 432 at the same position, as shown in FIG. 4.

The amount of the heat generated by the central heat generating part was 130 w, and the amount of each of the heat generated by the heat generating parts at end portions was 120 w. Three heat generating parts were effectively cooled without excessively heated by the use of the plate type heat pipe of the invention.

As described in detail above, the plate type heat pipe of the invention enables to effectively cool the heat generating parts such as semiconductor chips without causing the so-called dry out phenomenon even in case that the heat generating density of the heat generating part is high. The cooling device using the plate type heat pipe of the invention enables to realize effective cooling.

What is claimed is:

1. A plate type heat pipe comprising:
   two plate members facing each other to form a hermetically sealed container, on either one of which plate members at least one heat generating parts are mounted;
   at least one heat transfer block having a cross sectional area equal to or larger than a cross sectional area of said heat generating part, said block being disposed at a prescribed position within said hollow portion corresponding to a position of said plate member to which said heat generating part is thermally connected; and
   a working fluid enclosed in said hollow portion.

2. The plate type heat pipe as claimed in claim 1, wherein respective heat transfer blocks are disposed at said prescribed positions within said container corresponding to positions of said plate member to which plurality of said heat generating parts are thermally connected, said respective heat transfer blocks having respective cross sectional areas equal to or larger than a cross sectional area of corresponding heat generating parts.

3. The plate type heat pipe as claimed in claim 1, wherein at least one portions of said plate member to which said heat generating parts are thermally connected extend outward said container to form protruding portions.

4. The plate type heat pipe as claimed in claim 4, wherein a wick contacting said heat transfer block is disposed within said container.

5. The plate type heat pipe as claimed in claim 5, wherein edge portions of said heat transfer block are cut off.

6. The plate type heat pipe as claimed in claim 5, wherein said heat transfer block contacts with both of said two plate members.

7. The plate type heat pipe as claimed in claim 4, wherein a heat sink is disposed on one of said plate members to which said heat generating part is not connected.

8. The plate type heat pipe as claimed in claim 4, wherein said protruding portion is disposed in such manner that said protruding portion closely contacts with said heat generating part mounted on a printed wiring board.

9. The plate type heat pipe as claimed in claim 8, wherein said protruding portion is disposed in such manner that said protruding portion closely contacts with said heat generating part mounted on a printed wiring board.

10. A plate type heat pipe comprising:
    two plate members facing each other to form a hermetically sealed container, on either one of which plate members at least one heat generating parts are mounted;
    a heat transfer block disposed at a prescribed position within said container corresponding to a position of said plate member to which a heat generating part having a largest heat generating density is thermally connected, said heat transfer block having a cross sectional area equal to or larger than a cross sectional area of said heat generating part having a largest heat generating density; and a working fluid enclosed in said container.

11. A cooling apparatus comprising a plate type heat pipe having two plate members facing each other to form a hermetically sealed container, on either one of which plate members at least one heat generating parts are mounted and at least one heat transfer block having a cross sectional area equal to or larger than a cross sectional area of said heat generating part, said block being disposed at a prescribed position within said hollow portion corresponding to a position of said plate member to which said heat generating part is thermally connected, and a working fluid enclosed in said hollow portion, the plate type heat pipe being arranged to face a printed wiring board on which at least one of heat generating parts are mounted in such manner that said heat generating parts are in close contact with one of said plate member of said plate type heat pipe, and a heat sink is disposed on the other plate member of said plate type heat pipe.

12. A cooling apparatus comprising a plate type heat pipe having two plate members facing each other to form a hermetically sealed container, on either one of which plate members at least one heat generating parts are mounted and at least one heat transfer block having a cross sectional area equal to or larger than a cross sectional area of said heat generating part, said block being disposed at a prescribed position within said hollow portion corresponding to a position of said plate member to which said heat generating part is thermally connected, and a working fluid enclosed in said hollow portion, wherein at least one portion of said plate member to which said heat generating parts are thermally connected extend outward from said container to form protruding portions, the plate type heat pipe being arranged to face a printed wiring board on which at least one of heat generating parts are mounted in such a manner that said heat generating parts are in close contact with one of said plate member of said plate type heat pipe, and a heat sink is disposed on the other plate member of said plate type heat pipe.

* * * * *

UNITED STATES PATENT AND TRADEMARK OFFICE
CERTIFICATE OF CORRECTION

PATENT NO. : 6,263,959 B1
DATED : July 24, 2001
INVENTOR(S) : Ikeda et al.

It is certified that error appears in the above-identified patent and that said Letters Patent is hereby corrected as shown below:

Title page,
Item [56], References Cited, please insert -- FOREIGN PATENT DOCUMENTS, 7-208884 8/1995 (JP); 10-227585 8/1998 (JP); 10-288481 10/1998 (JP) --

Column 10,
Line 40, after "claim" delete "4" and insert therefor -- 3 --
Line 43, after "claim" delete "5" and insert therefor -- 4 --
Line 45, after "claim" delete "5" and insert therefor -- 4 --
Line 55, after "claim" delete "8" and insert therefor -- 7 --

Signed and Sealed this

Twelfth Day of April, 2005

JON W. DUDAS
*Director of the United States Patent and Trademark Office*